United States Patent
Kawai (10) Patent No.: US 10,165,714 B2
(45) Date of Patent: Dec. 25, 2018

(54) NOISE CURRENT ABSORBER

(71) Applicant: Kitagawa Industries Co., Ltd., Aichi (JP)

(72) Inventor: Hideharu Kawai, Aichi (JP)

(73) Assignee: Kitagawa Industries Co., Ltd., Aichi (JP)

( * ) Notice: Subject to any disclaimer, the term of this patent is extended or adjusted under 35 U.S.C. 154(b) by 3 days.

(21) Appl. No.: 15/585,244

(22) Filed: May 3, 2017

(65) Prior Publication Data

US 2017/0325367 A1    Nov. 9, 2017

(30) Foreign Application Priority Data

May 6, 2016    (JP) .................. 2016-093474

(51) Int. Cl.
*H05K 9/00*    (2006.01)
*H01F 17/06*    (2006.01)
*H01F 27/02*    (2006.01)

(52) U.S. Cl.
CPC .......... *H05K 9/0098* (2013.01); *H01F 17/06* (2013.01); *H01F 27/02* (2013.01); *H05K 9/0007* (2013.01); *H05K 9/0075* (2013.01); *H01F 2017/065* (2013.01)

(58) Field of Classification Search
CPC .. H01F 2017/065; H01F 27/02; H05K 9/0098
See application file for complete search history.

(56) References Cited

U.S. PATENT DOCUMENTS

| 2012/0205367 A1* | 8/2012 | Kawai | ................ H01F 17/06 |
| | | | 220/4.21 |
| 2015/0208519 A1* | 7/2015 | Kawai | ................ H01F 27/02 |
| | | | 336/90 |
| 2016/0073557 A1 | 3/2016 | Kawai | |

FOREIGN PATENT DOCUMENTS

| JP | H0291903 | 3/1990 |
| JP | 2015035476 | 2/2015 |

* cited by examiner

*Primary Examiner* — Hung V Ngo
(74) *Attorney, Agent, or Firm* — Renner, Otto, Boisselle & Sklar, LLP (57) ABSTRACT

A noise current absorber including a pair of housing parts capable of housing each of the pair of magnetic bodies, wherein the pair of magnetic bodies forms an overall cylindrical shape or a ring shape when abutted against each other; an engaging portion and an engaged portion capable of maintaining a closed state of the pair of housing parts; and a wall molded integrally with at least a first housing part of the pair of housing parts, adjacent to an abutting surface of at least the first housing part against a second housing part of the pair of housing parts, the wall protruding to a side where the second housing part abuts.

10 Claims, 7 Drawing Sheets

NOISE CURRENT ABSORBER

CROSS-REFERENCE TO RELATED APPLICATIONS

This application claims the benefit of Japanese Patent Application No. 2016-93474 filed on May 6, 2016 with the Japan Patent Office, the entire disclosure of which is incorporated herein by reference.

BACKGROUND

The present disclosure relates to a noise current absorber that is attached to an electric wire and that absorbs noise current flowing in the electric wire.

Conventionally, noise current absorbers are known that are attached to electric wires and that absorb noise current flowing in the electric wires. An example of this type of noise current absorber includes a pair of magnetic bodies and a pair of housing parts. In this noise current absorber, when the magnetic bodies are abutted against each other, an overall cylindrical or ring shape (hereinafter, both shapes are referred to collectively as "cylindrical shape") is formed. Additionally, the pair of housing parts is capable of holding the magnetic bodies in a state in which the magnetic bodies exhibit the cylindrical shape. As the configuration of the pair of housing parts, a shape such as that described in, for example, Japanese Unexamined Patent Application Publication No. 2015-035476A is considered. Specifically, each of the housing parts includes a concave portion, and each of the magnetic bodies is capable of being housed in each of the concave portions. This pair of housing parts is configured such that the pair of magnetic bodies exhibits a cylindrical shape at a time of closure, that is, when the concave portions are abutted against each other while the magnetic bodies are housed in the concave portions. Additionally, at least two pairs consisting of an engaging portion and an engaged portion are provided on the pair of housing parts, and these engaging portions and engaged portions engage at the time of closure. As a result, the closed state of the pair of housing parts is maintained and the closed state in which the pair of magnetic bodies exhibits a cylindrical shape is maintained.

When the noise current absorber with such a structure is attached to an electric wire, the pair of magnetic bodies forming a cylindrical shape surrounds the outer periphery of the electric wire. As a result, the pair of magnetic bodies magnetically forms a closed magnetic path and exerts the intended noise current absorbing capacity.

SUMMARY

However, such a noise current absorber may be installed on an installation target such as a chassis or the like and, in such cases, the noise current absorber may be installed on the installation target using a screw. As an installation method using a screw, methods are considered such as providing a screw hole in the noise current absorber itself into which a screw can be inserted or, alternatively, fixing a belt-like member, that includes screw holes at both ends into which screws can be inserted, across the noise current absorber to the installation target (see, for example, Japanese Unexamined Patent Application Publication No. H02-091903). In such methods, due to the rotating of the screw, forces are sometimes applied that cause the pair of housing parts to become relatively displaced.

As such, with a noise current absorber in which a pair of magnetic bodies, which exhibit a cylindrical shape when abutted against each other, is housed in a pair of housing parts, it is preferable that displacement of the pair of housing parts is suppressed when installing the pair of housing parts maintained in a closed state on the installation target using a screw.

A noise current absorber described below includes a pair of magnetic bodies that exhibit an overall cylindrical shape or ring shape when abutted against each other; a pair of housing parts each including a concave portion, each of the concave portions being capable of housing each of the pair of magnetic bodies, and the pair of magnetic bodies exhibiting a cylindrical shape or ring shape at a time of closure when the concave portions are abutted against each other while the magnetic bodies are housed in the concave portions; an engaging portion and an engaged portion provided on each of the pair of housing parts across a center of the cylinder or ring of the pair of magnetic bodies, by engaging with each other at the time of closure, the engaging portion and the engaged portion being capable of maintaining a closed state where the pair of magnetic bodies exhibits a cylindrical shape or a ring shape; and a wall molded integrally with at least a first housing part of the pair of housing parts, adjacent to an abutting surface of at least the first housing part against a second housing part of the pair of housing parts, the wall protruding to a side from which the second housing part abuts.

Additionally, a side where the wall is adjacent to the abutting surface is a side where, when installing the pair of housing parts for which the closed state is maintained to an installation target of the pair of housing parts using a screw, the second housing part tends to become relatively displaced from the first housing part due to the rotating of the screw. Furthermore, dimensions of the wall are dimensions whereby the second housing part can be suppressed from becoming relatively displaced from the first housing part due to the rotating of the screw by the second housing part abutting against the wall.

According to the noise current absorber configured in this manner, the pair of magnetic bodies exhibits a cylindrical shape at the time of closure, that is, when the concave portions are abutted against each other while the magnetic bodies are housed in the concave portions of the pair of housing parts. At the time of closure, the engaging portion and the engaged portion provided on each of the pair of housing parts engage with each other and, as a result, the closed state where the pair of magnetic bodies exhibits a cylindrical shape is maintained.

Additionally, the wall is molded integrally with at least the first housing part, adjacent to the abutting surface of at least the first housing part against the second housing part. This wall protrudes to the side from which the second housing part abuts, and the adjacent side is a side where, when installing the pair of housing parts for which the closed state is maintained to an installation target using a screw, the second housing part tends to become relatively displaced from the first housing part due to the rotating of the screw.

As such, when installing the noise current absorber on an installation target using a screw, at least the second housing part will tend to become relatively displaced from the first housing part and abut against the wall. The dimensions of the wall are dimensions whereby the second housing part can be suppressed from becoming relatively displaced from the first housing part due to the rotating of the screw by the second housing part abutting against the wall. As such, when installing the pair of housing parts, for which the closed state is maintained by the engaging of the engaging portion and the engaged portion, on an installation target using a screw, displacement of the pair of housing parts can be suppressed by the wall.

DETAILED DESCRIPTION OF THE PREFERRED EMBODIMENTS

In the following, embodiments of the present disclosure are described while referring to the drawings. Note that, in the following description, up-down, left-right, and front-back directions are defined out of necessity. However, it should be understood that these directions are defined only for the purpose of facilitating a simple description of the relative positional relationships of the constituents of the noise current absorber. When actually using the noise current absorber, the noise current absorber may be oriented in any direction. For example, the noise current absorber may be used in a state where the up-down direction illustrated in the drawings does not match the vertical direction in relation with gravity.

1. First Embodiment 1-1. Overall Configuration

Figure 1:
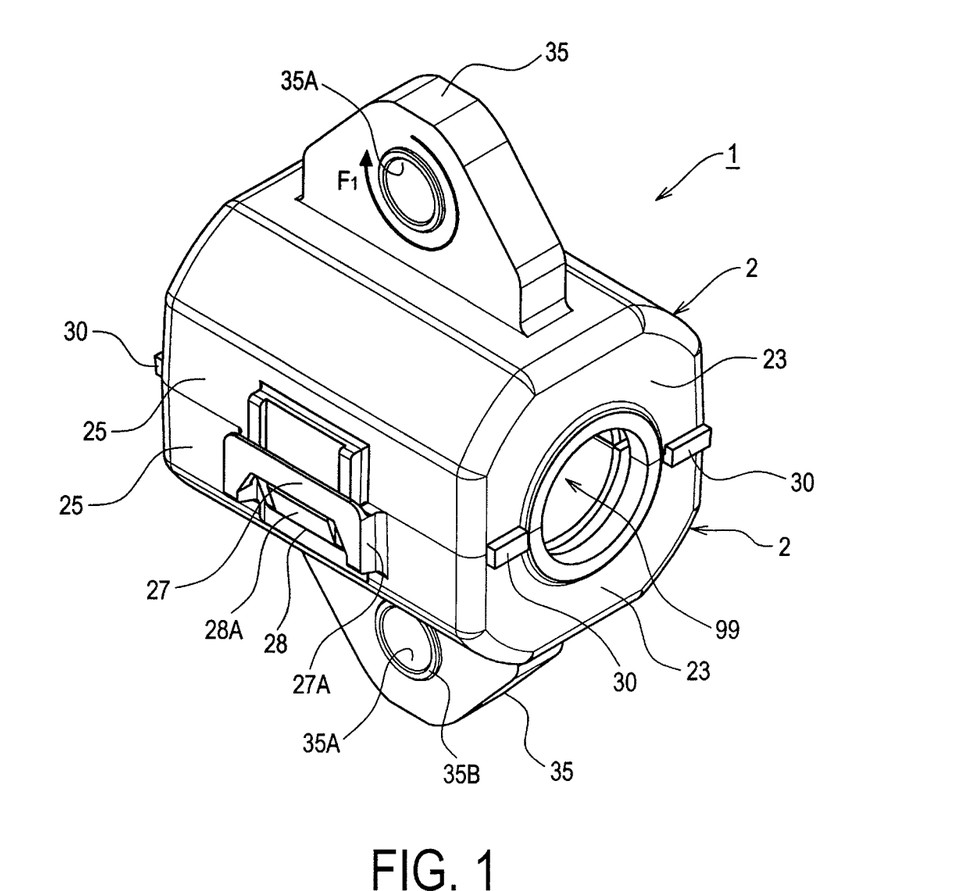
FIG. 1 is a perspective view of a noise current absorber of a first embodiment, viewed from the upper left front.
Figures 2A, 2E:
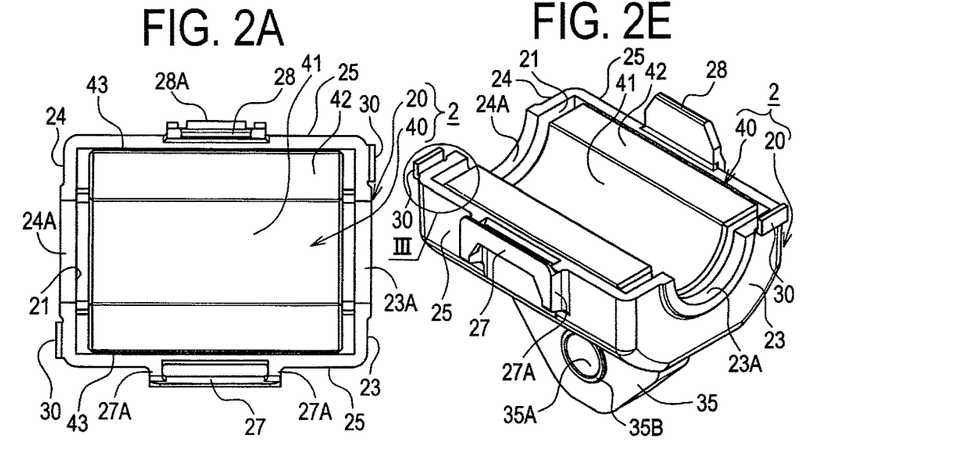
FIG. 2A is a plan view of a first unit of the noise current absorber of the first embodiment.
FIG. 2E is a perspective view of the unit, viewed from the upper left front.
Figure 2B:
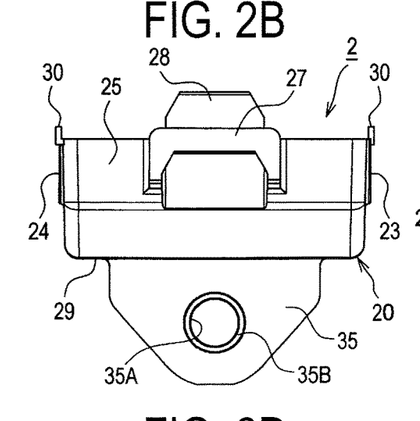
FIG. 2B is a left side view of the unit.
Figure 2C:
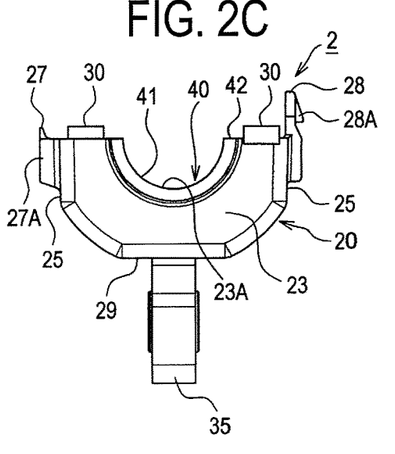
FIG. 2C is a front view of the unit.
Figure 2D:
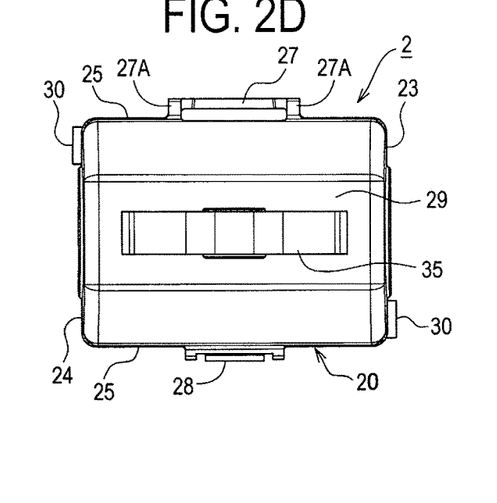
FIG. 2D is a bottom view of the unit.

A noise current absorber 1 illustrated in FIG. 1 is configured to be installed around the outer periphery of an electric wire L for the purpose of absorbing noise current flowing through the electric wire L (see FIG. 7). This noise current absorber 1 comprises a combination of a pair of units 2, 2 of the same shape (manufacturing errors are allowable). As illustrated in FIGS. 2A to 2E, each unit 2 includes a resin part 20 (an example of the housing part) and a magnetic body 40.

Each magnetic body 40 is formed in the same shape. Specifically, each magnetic body 40 has a half-cylindrical shape and, when abutted against each other, exhibits an overall cylindrical shape. An inner surface 41 of each magnetic body 40 has a cylindrical surface shape and, when abutting surfaces 42 of a pair of the magnetic bodies 40 are abutted against each other such that the pair of magnetic bodies 40 are combined in a cylindrical shape, a through-hole 99 with a cylindrical shape (see FIG. 1) is formed. The pair of units 2, 2 is combined so as to engage the electric wire L in the through-hole 99. When one of the units 2 (that is, one of the resin part 20 and magnetic body 40) is rotated 180 degrees around a central axis of the through-hole 99, this unit 2 assumes the same shape as the other unit 2. Note that, in the following description, for each unit 2, the abutting surface 42 side may be referred to as upward and a central axis direction of the through-hole 99 may be referred to as the front-back direction.

Each resin part 20 includes a concave portion 21 that houses one of the magnetic bodies 40 from a side of a bottom surface thereof (that is, the surface of the side opposite the inner surface 41 and the abutting surface 42). A notch 23A, having a semicircular shape and through which the electric wire L penetrates, is formed in a wall surface 23 provided on one side in the front-back direction of the concave portion 21; and a notch 24A, likewise having a semicircular shape and through which the electric wire L penetrates, is formed in the other wall surface 24.

Additionally, an engaged portion 27 and an engaging portion 28 are formed on outside surfaces of side walls 25, 25 of each resin part 20, which support side surfaces 43, 43 of the magnetic body 40 from the outside. The engaged portion 27 and the engaging portion 28 are configured to engage with each other at a time of closure when the concave portions 21, 21 of the pair of resin parts 20, 20 are abutted against each other. The engaged portion 27 is erected at a position raised from side wall 25 by a leg 27A that is formed on both ends in the front-back direction of the engaged portion 27. The engaging portion 28 protrudes upward so as to be insertable into space between the engaged portion 27 and the side wall 25 of the other resin part 20. Additionally, a hook 28A, having a cross sectional hook shape and that engages with the engaged portion 27 after the insertion, is formed on the engaging portion 28.

Thus, at the time of closure, the hook 28A of the engaging portion 28 formed on one resin part 20 engages with the engaged portion 27 formed on the other resin part 20 while elastically deforming. Additionally, the hook 28A of the engaging portion 28 formed on the other resin part 20 engages with the engaged portion 27 formed on the one resin part 20 while elastically deforming. As a result, the pair of resin parts 20, 20 are fixed to each other, and the closed state, in which the magnetic bodies 40, 40 housed in the concave portions 21, 21 exhibit a cylindrical shape, is maintained.

Additionally, at this time, walls 30, 30, molded integrally with each resin part 20 so as to protrude upward adjacent to the outer sides of the wall surfaces 23 and 24 of each resin part 20, engage with the outside surfaces of the wall surfaces 23 and 24 of the other resin part 20. As a result, the pair of resin parts 20, 20 are fixed to each other in a more excellent manner. Note that the configuration of the walls 30, 30 is described later.

A fixing member 35 in which a screw hole 35A is drilled is molded integrally with a bottom 29 of each resin part 20 that supports the bottom surface of the magnetic body 40 from the outside (that is, the lower side). This fixing member 35 is configured in roughly a right-angled isosceles triangular plate shape that has a hypotenuse thereof on the surface of the bottom 29 along front-back direction (the central axis direction of the cylinder formed by the magnetic bodies 40, 40 being abutted against each other), and extends in a direction away from the central axis. Moreover, the screw hole 35A is formed at an intermediate point between the apex opposite the hypotenuse and a midpoint of the hypotenuse. The screw hole 35A penetrates the fixing member 35 in a thickness direction of the plate (that is, in the left-right direction). Additionally, a collar 35B made from metal is provided on the openings of the screw hole 35A.

1-2. Specific Configuration of the Wall

Here, it is assumed that the noise current absorber 1 is to be installed on an installation target such as a chassis or the like by inserting a screw (e.g. a bolt or a vis; not illustrated in the drawings) into the screw hole 35A. In this case, when tightening the screw to fix the fixing member 35 to the installation target, a force such as, for example, that indicated by arrow F1 in FIG. 1, may be applied to the fixing member 35 due to the rotating of the screw. In such a case, the wall surface 24 of the upper resin part 20 is pressed against the wall 30 protruding from the wall surface 24 (see FIGS. 2A to 2E) of the lower resin part 20 of FIG. 1 due to the force. Likewise, the wall 30 protruding from the wall surface 23 of the upper resin part 20 of FIG. 1 is pressed against the wall surface 23 of the lower resin part 20 due to the force.

Figure 3:
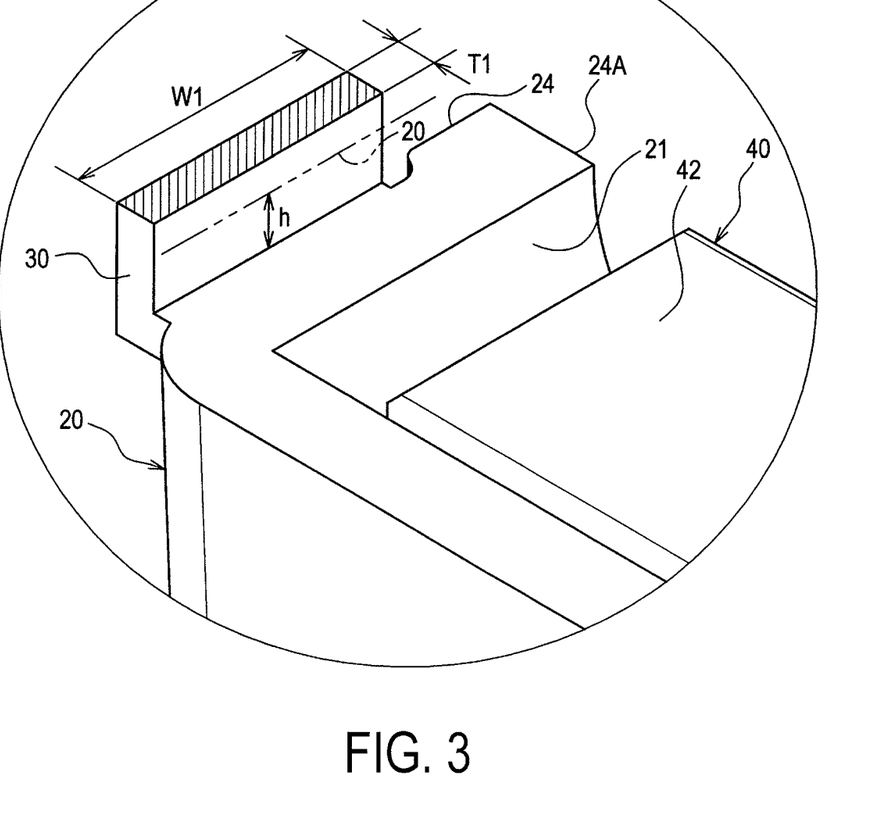
FIG. 3 is a partially enlarged view of section III of FIG. 2E.

Here, in the present embodiment, the dimensions of the wall 30 are designed as follows and, as such, the resin parts 20, 20 are suppressed from becoming displaced from each other due to the force. Specifically, as enlarged and illustrated in FIG. 3, the wall 30 is configured in a rectangular parallelepiped shape (that is, a prismatic shape) having sides along the front-back, left-right, and up-down directions. Additionally, a lower end portion of the wall 30 is molded integrally with the resin part 20 and, as such, the wall 30 can be thought of as a cantilevered beam in which the lower end portion is supported by the resin part 20. In FIG. 3, the surface regarded as the cross section of the cantilevered beam is marked with hatching. This surface is not actually a cross section, but rather an upper end surface of the wall 30. The hatching has been added for the purpose of facilitating description.

h is defined as a protruding amount (that is, height) from the resin part 20 at a position where the other resin part 20 makes line contact with the wall 30; T1 is defined as a dimension (i.e., thickness) of the wall 30 in the front-back direction; and W1 is defined as a dimension (i.e., width) of the wall 30 in the left-right direction. In this case, the following relationship exists between a load P applied from the other resin part 20 to the wall 30 and a deformation amount d of the wall 30.

$$W1 = P \cdot h3 \cdot 12/(3 \cdot E \cdot T13 \cdot d)$$

Note that E represents Young's modulus, which is 1200 for resins typically used for the resin part 20. T1 is a minimum dimension necessary for the wall 30 to be established after molding, and is calculated to be 0.6 mm. h is a minimum dimension necessary for the wall 30 to be established after molding and takes the gap between the resin parts 20 of this type of noise current absorber 1 into consideration, and is calculated to be 0.5 mm. d is a value at which the effects of deformation can be ignored, and is assumed to be 0.1. That is, in the present specification, "suppressing displacement" means being able to ignore the effects of the displacement. The range that can be ignored can be appropriately set depending on the application or the like.

The load P is estimated as follows. In many cases, a screw strength classification of 8.8 or higher is required for fixing a noise current absorber 1 to be installed in the engine room of an automobile. Tightening torque is 7.85 N·m when the screw hole 35A is configured to accept a M6 size bolt. The distance from the center of the screw hole 35A to the wall 30 is 0.002 m at shortest. As such, when all the torque is applied to the two walls 30, a maximum force of 393 N is applied to the two walls 30. When the force is dispersed equally on the two walls 30, the load P on each wall 30 is 196.5 N and the deformation amount d with respect to this load P of 196.5 N is required to be 0.1 or less.

Accordingly, the relationship W1≥3.8 mm needs to be satisfied in order to be able to ignore the effects of deformation of the noise current absorber 1 when the noise current absorber 1 is installed in an engine room and subjected to a load P such as that described above. Thus, in the present embodiment, the wall 30 is designed such that T1≥0.6 mm and W1≥3.8 mm. Note that in cases where there is only one wall 30 that bears the load P, the relationship W1≥7.6 mm needs to be satisfied.

1-3. Advantageous Effects

The following advantageous effects are obtained according to the first embodiment described above.

(1A) When the noise current absorber 1 configured as described above is attached to an electric wire L, the pair of magnetic bodies 40 that exhibits a cylindrical shape surrounds the outer periphery of the electric wire L. As a result, the pair of magnetic bodies 40 magnetically forms a closed magnetic path and exerts the intended noise current absorbing capacity. Moreover, the closed state is maintained in an excellent manner due to the engaging of the engaged portion 27 and the engaging portion 28.

(1B) The upper resin part 20 in FIG. 1 tends to become relatively displaced from the lower resin part 20 when the noise current absorber 1 is installed on the installation target using a screw as described above. At this time, each resin parts 20 abuts against the wall 30 of the other resin part 20. As described above, the dimensions of the wall 30 are dimensions whereby relative displacement of the resin parts 20 can be suppressed. As such, when installing the pair of resin parts 20, for which the closed state is maintained due to the engaging of the engaging portion 28 and the engaged portion 27, on the installation target using a screw, displacement of the pair of resin parts 20 can be suppressed in an excellent manner by the walls 30.

(1C) Each resin part 20 is provided with a wall 30 that acts in cases where the force applied from the screw is in the direction of the arrow F1 (an example of the first rotation direction), and a wall 30 that acts in cases where the force applied from the screw is in the direction opposite the arrow F1 (an example of the second rotation direction). As such, displacement of the pair of resin parts 20 can be suppressed in an excellent manner as described above, even in cases where the direction of the force applied to the fixing member 35 is reversed due to the positional relationship of the screw with the installation target. Moreover, the wall 30 is molded integrally with each resin part 20. As such, it is possible to reduce the dimensions of the wall 30 compared to a case where the wall 30 is only provided on one resin part 20.

(1D) Each wall 30 is formed at a location of each resin part 20 farthest away from the screw hole 35A. As such, displacement of the resin parts 20 can be suppressed with an even smaller force, and the dimensions of the wall 30 can be made even smaller.

(1E) The wall 30 is molded integrally with each resin part 20 so as to protrude upward adjacent to the outer side of the wall surfaces 23 and 24 of each resin part 20, and engage with the outside surfaces of the wall surfaces 23 and 24 of the other resin part 20. As such, compared to a case where the wall 30 is provided inside the side surfaces 23 and 24, dust and debris can be prevented from getting between the abutting surfaces of the resin parts 20 in an excellent manner.

2. Second Embodiment

2-1. Differences from First Embodiment

The configuration of the second embodiment is fundamentally the same as the configuration of the first embodiment. As such, description will be focused on differences and description of configurations that are the same will be omitted. Note that reference numerals in the present embodiment that are the same as those used in the first embodiment refer to the same constituents, and reference is made to the preceding description.

Figure 4:
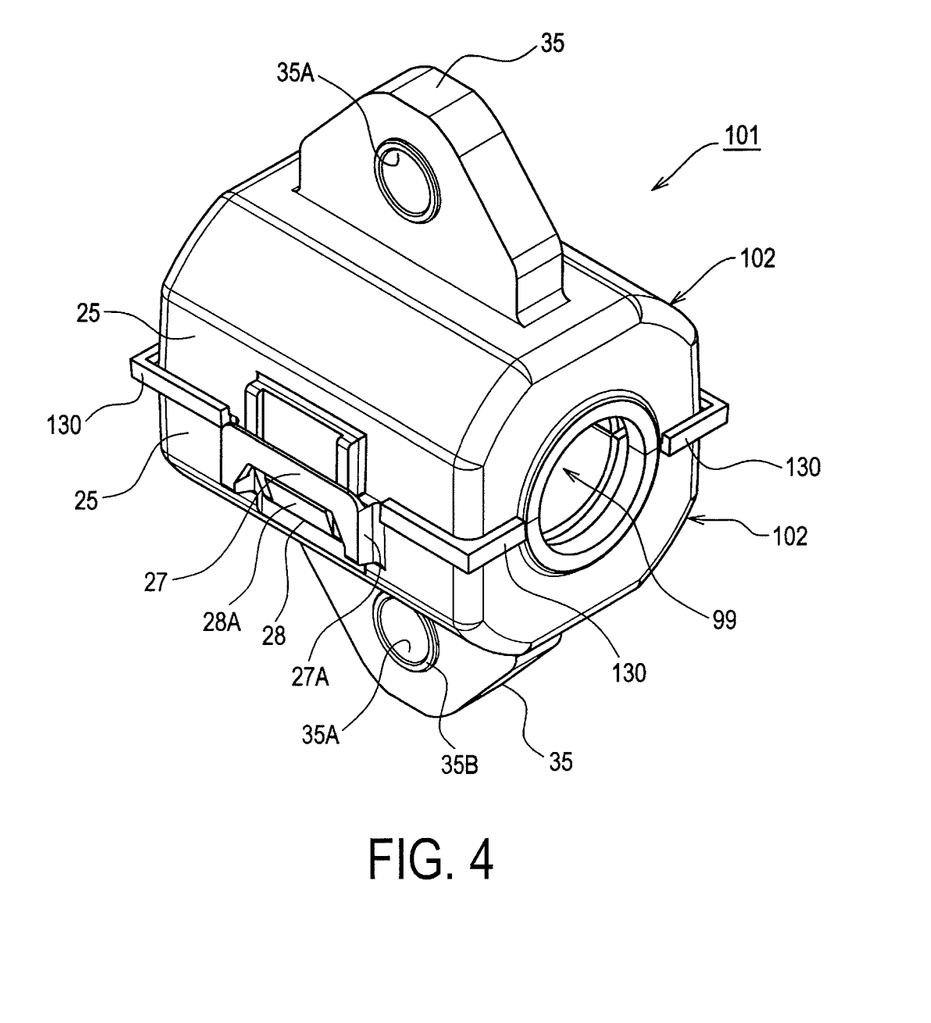
FIG. 4 is a perspective view of a noise current absorber of a second embodiment, viewed from the upper left front.

With the noise current absorber 1 of the first embodiment described above, the wall 30 is configured in a prismatic shape, that is, as a cantilevered beam having a rectangular cross section. In contrast, a noise current absorber 101 of the second embodiment illustrated in FIGS. 4 to 6 differs from the first embodiment in that a wall 130 molded integrally with the resin part 20 of each unit 102 has an L-shaped cross section.

Figures 5A, 5E:
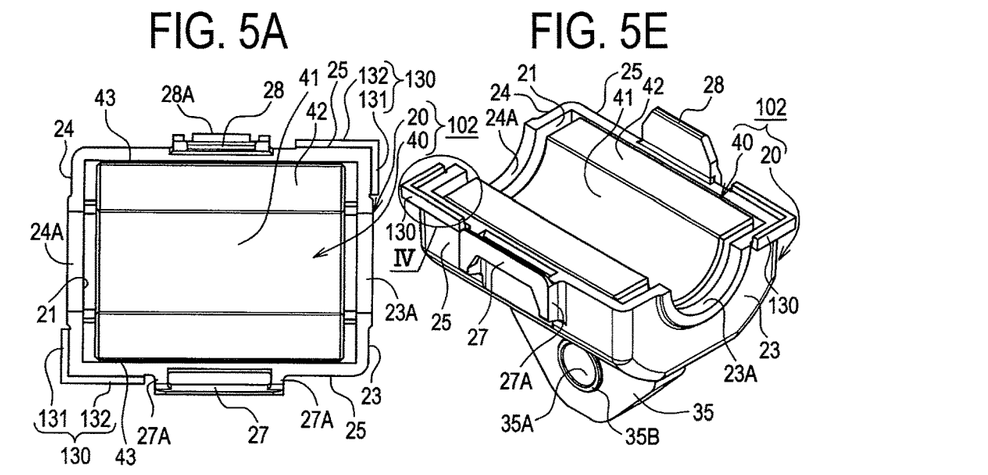
FIG. 5A is a plan view of a first unit of the noise current absorber of the second embodiment.
FIG. 5E is a perspective view of the unit, viewed from the upper left front.
Figure 5B:
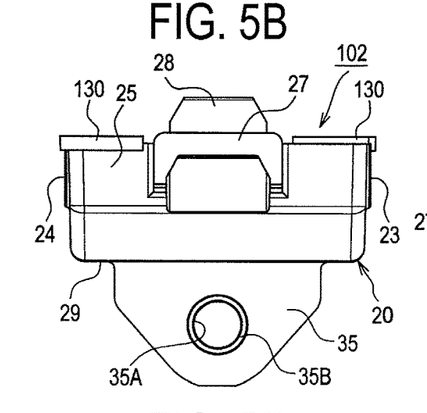
FIG. 5B is a left side view of the unit.
Figure 5C:
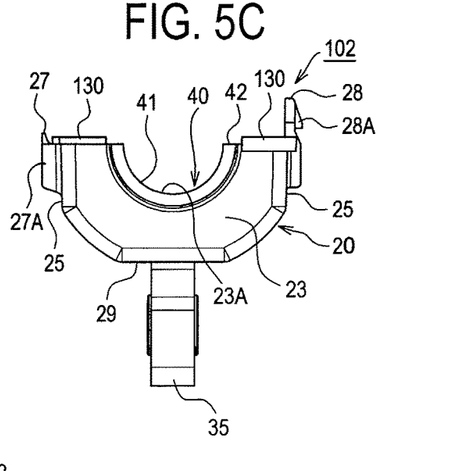
FIG. 5C is a front view of the unit.
Figure 5D:
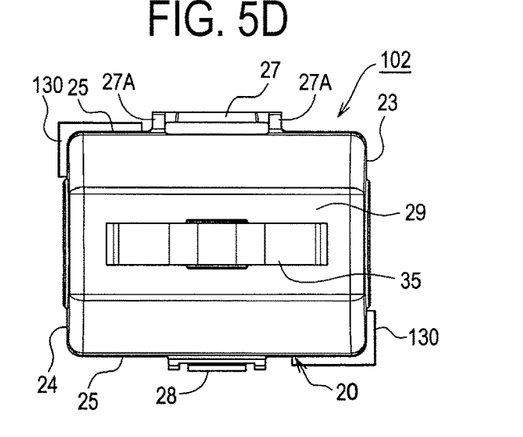
FIG. 5D is a bottom view of the unit.
Figure 6:
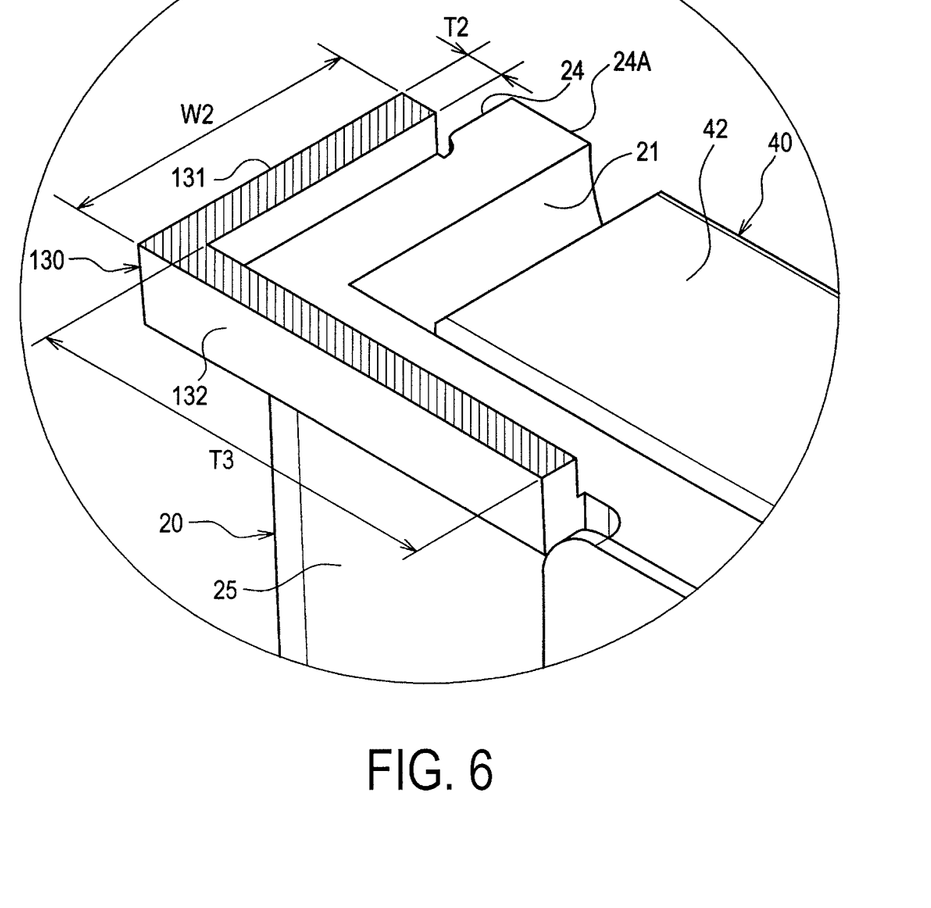
FIG. 6 is a partially enlarged view of section IV of FIG. 5E.

Specifically, as illustrated in FIGS. 5A and 6, the wall 130 includes a first wall portion 131 (an example of the wall) that protrudes from the outside surface of the wall surfaces 23 and 24 and a second wall portion 132 (an example of the auxiliary wall) that protrudes from the outside surface of the side walls 25. The first wall portion 131 and the second wall portion 132 are molded integrally with each other and, also, are molded integrally with the resin part 20.

Additionally, when the closed state of the pair of resin parts 20, 20 is maintained due to the engagement of the pairs of engaged portions 27, 27 and engaging portions 28, 28, the walls 130, 130 engage with the wall surfaces 23 and 24 and the outside surfaces of the side walls 25 of the other resin part 20.

2-2. Advantageous Effects

In addition to the advantageous effects (1A) to (1E) of the first embodiment described above, the following advantageous effects are obtained according to the second embodiment.

(2A) Due to the fact that the wall 130 includes the second wall portion 132, the cross-sectional secondary moment with respect to the force indicated by the arrow F1 is significantly increased. For example, in a case where a thickness T2 of the first wall portion 131 is the same as the thickness T1 of the wall 30 of the first embodiment and a width W2 of the first wall portion 131 is 1.9 mm, if a dimension (i.e., thickness) T3 in the front-back direction of the second wall portion 132 is 0.9 mm and a dimension (i.e. width) in the left-right direction of the second wall portion is 0.6 mm, the same as the thickness T1 of the wall 30, the two walls 130 will be able to bear forces of 393 N or greater. Note that the thickness T3 is a dimension excluding the L-shaped corner portion, which is the overlapping portion of the first wall portion 131 and the second wall portion 132. As such, an overall length (i.e. W2+T3) of the wall 130 is about 26% shorter than the width W1 of the wall 30 and, as a result, significant miniaturization is possible.

(2B) Additionally, when the pair of resin parts 20, 20 is maintained in the closed state, the walls 130, 130 engage with the wall surfaces 23 and 24 and the outside surfaces of the side walls 25 of the other resin part 20. As such, the pair of resin parts 20, 20 is fixed in a more excellent manner, and dust and debris can be prevented from getting between the abutting surfaces of the resin parts 20 in a better manner.

(2C) In the present embodiment, each of the four corners of the abutting surfaces of the resin parts 20, 20 engages with the L-shaped wall 130. As such, displacement or deflection of the resin parts 20 in not only the tightening direction of the screw (that is, the direction of the arrow F1) but also in the insertion direction of the screw can be suppressed. Accordingly, characteristic stability against deviations in the parallelism of the pair of fixing members 35, 35 is improved.

3. Third Embodiment

3-1. Differences from Second Embodiment

The configuration of the third embodiment is fundamentally the same as the configuration of the second embodiment. As such, description will be focused on differences and description of configurations that are the same will be omitted. Note that reference numerals in the present embodiment that are the same as those used in the second embodiment refer to the same constituents, and reference is made to the preceding description.

With the noise current absorber 101 of the second embodiment described above, the fixing member 35 was provided on the bottom 29 of each resin part 20 in the same manner as the noise current absorber 1 of the first embodiment. In contrast, a noise current absorber 201 of the third embodiment illustrated in FIGS. 7A to 7D differs from the second embodiment in that the resin part 20 of each unit 202 does not include the fixing member 35 and, instead, ribs 229 are integrally molded with an outer peripheral surface of each resin part 20.

The ribs 229 are orthogonal to the central axis of the cylinder formed by the pair of magnetic bodies 40, 40, and are provided along two flat surfaces separated by a predetermined spacing. The predetermined spacing is a width of a belt-like member 900 described hereinafter. The belt-like member 900 is a metal member that includes a main body portion 901 curved in a U-shape in a thickness direction, and a pair of fixing portions 902, 902 extending so as to spread outward from both ends of the main body portion 901. A screw hole 903 into which a screw (e.g., a bolt or a vis; not illustrated in the drawings) can be inserted is formed in each fixing portion 902.

Additionally, a total of four ribs 229 are formed between the bottom 29 and the side walls 25 of each resin part 20. The ribs 229 are configured such that the bottom 29 and the edges of the ribs 229 are arranged on the same plane. As such, by abutting the bottom 29 and the edges of the ribs 229 against a flat surface such as a chassis or the like (an example of the installation target) and fixing the belt-like member 900 across the noise current absorber 201 to the flat surface using screws, the noise current absorber 201 can be fixed to the flat surface. At this time, the main body portion 901 of the belt-like member 900 is fitted between the ribs 229 disposed at the predetermined spacing and, thus, is positioned on the noise current absorber 201. As a result, the noise current absorber 201 is fixed to the flat surface.

3-2. Advantageous Effects

Figure 7A:
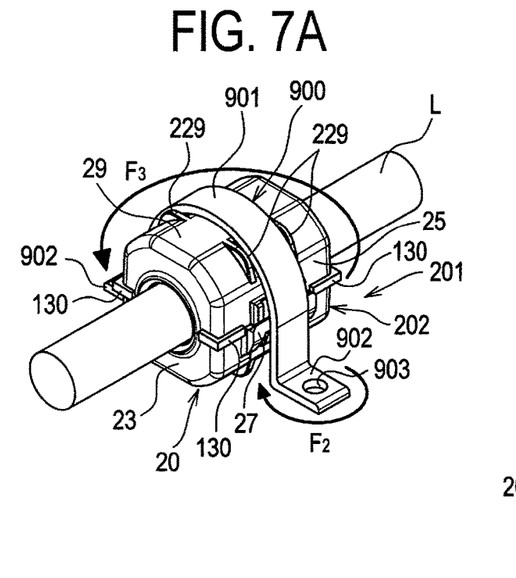
FIG. 7A is a perspective view of a noise current absorber of a third embodiment in an installed state, viewed from the upper left front.
Figure 7B:
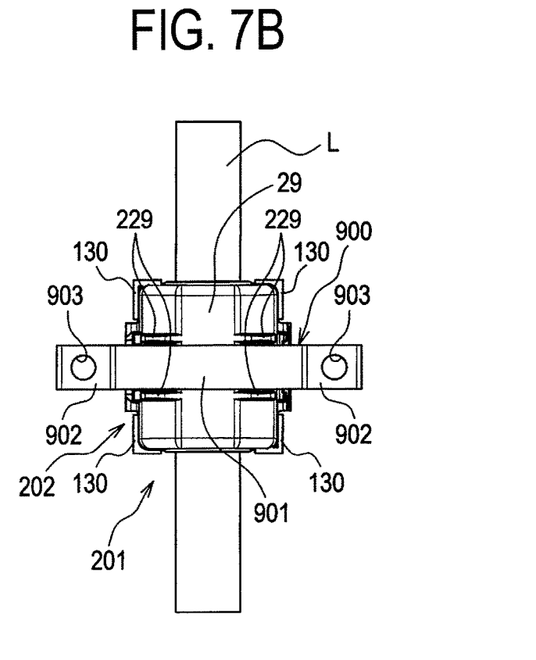
FIG. 7B is a plan view of the noise current absorber.
Figure 7C:
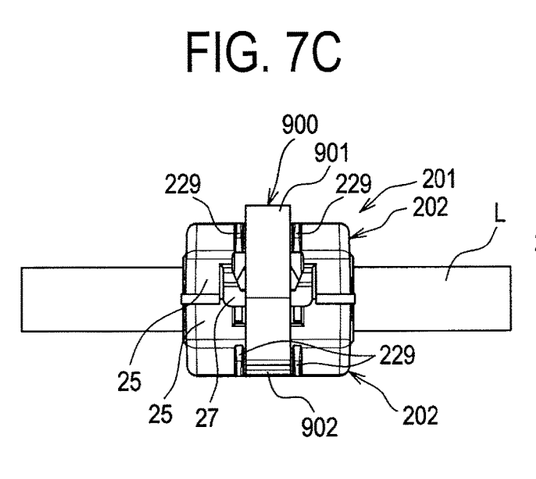
FIG. 7C is a side view of the noise current absorber.
Figure 7D:
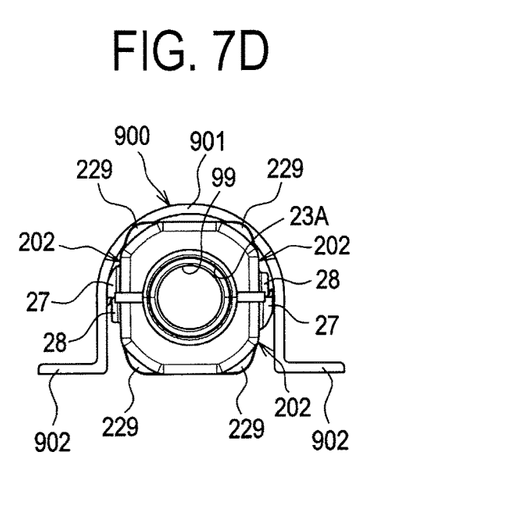
FIG. 7D is a front view of the noise current absorber.

The advantageous effects (1A) to (1E) and (2A) to (2C) are also obtained with the third embodiment. Specifically, in this case, when a force such as that indicated by arrow F2 in FIG. 7A is applied to the fixing portion 902 due to the rotating of the screw, a force such as that indicated by arrow F3 is applied to the upper unit 202 in FIG. 7A. However, displacement of the resin parts 20 caused by this force can be suppressed by the walls 130. Additionally, in the present embodiment, the noise current absorber 201 can be installed on an installation target such as a chassis or the like without tightening screws directly in the noise current absorber 201.

As illustrated in FIGS. 7A to 7D, the advantageous effects become even more significant when the electric wire L is inserted into the through-hole 99 (see FIG. 1) and the electric wire L is fixed to the flat surface. In this case, forces act to suppress rotation of the unit 202 in the direction of the arrow F3 due to the electric wire L abutting against the inner surface 41 of the magnetic bodies 40 in addition to the frictional forces acting between the flat surface and the edges of the ribs 229 and the bottom 29. Accordingly, while displacement between the pair of resin parts 20, 20 is more likely to occur, in the present embodiment, the occurrence of this displacement can be suppressed by the walls 130. Note that, in the present embodiment, the wall 30 of the first embodiment may be substituted for the wall 130.

4. Other Embodiments

Descriptions of embodiments of the present disclosure have been given above, but the present disclosure is not limited to these embodiments and various modifications may be made.

(4A) In the first and second embodiments, the fixing member 35 is provided on the bottom 29 of each resin part, but the position where the fixing member 35 is provided is not limited thereto. For example, a configuration is possible in which the fixing member 35 is provided on the outside surface of one of the left and right side walls 35, extending in a direction away from the central axis of the cylinder formed by the pair of magnetic bodies 40, 40.

(4B) In the embodiments described above, the wall 30 or the wall 130 is provided on the outer surface of the resin part 20, but the position where the wall 30 or the wall 130 is provided is not limited thereto. For example, a configuration is possible in which the wall 30 or the wall 130 is provided on the inner surface of the resin part 20 (that is, in a gap between the resin part 20 and the magnetic part 40).

(4C) In the embodiments described above, one pair of the engaged portion 27 and the engaging portion 28 is provided on each of the pair of resin parts 20, 20, across the center of the cylinder formed by the pair of magnetic bodies 40, 40. However, the number of pairs of the engaged portion 27 and the engaging portion 28 that is provided is not limited thereto and a plurality of pairs may be provided. Additionally, the noise current absorber may be configured by combining a resin part 20 in which one or a plurality of the engaged portion 27 is provided on each of the left and right side walls 25, 25, and a resin part 20 in which one or a plurality of the engaging portion 28 is provided on each of the left and right side walls 25, 25.

(4D) Pluralities of functions of single constituents in the embodiments described above may be realized by pluralities of constituents, and single functions of single constituents may be realized by pluralities of constituents. Additionally, pluralities of functions of pluralities of constituents may be realized by single constituents, and single functions realized by pluralities of constituents may be realized by single constituents. Parts of the configurations in the embodiments described above may be omitted. At least part of the configuration of one of the embodiments described above may be added to or replace the configuration of another of the embodiments described above. Note that all embodiments encompassed within the technical spirit defined by the language of the appended claims fall within the scope of the present disclosure.

5. Supplemental Description

Note that, as clear from the exemplary embodiments described above, the noise current absorber of the present disclosure may be further provided with configurations such as those given below.

(5A) The wall may be molded integrally with each housing part. In this case, compared to a case where the wall is only provided on one housing part, displacement of the pair of housing parts can be suppressed in a better manner, even when the wall is small.

(5B) The wall may be provided in plurality so as to suppress each of displacement occurring when the screw is rotated in a first rotation direction, and displacement occurring when the screw is rotated in a second rotation direction different from the first rotation direction. In this case, compared to a case where the wall is provided only against the displacement occurring when the screw is rotated in one direction, displacement of the pair of housing parts can be suppressed in an excellent manner, even if the rotation direction of the screw when fixing changes such as in a situation where the arrangement of the screw hole and the installation target changes.

(5C) The wall may engage with the outside surface of the other housing part at the time of closure. In this case, the pair of housing parts is fixed together in a better manner, and dust and debris can be prevented from getting between the abutting surfaces of the housing parts in an excellent manner.

(5D) The noise current absorber may further include a pair of fixing members configured to be fixed to the installation target, each of the pair of fixing members being molded integrally on an outer side of each of the housing parts, and including a screw hole in which the screw can be inserted in a direction orthogonal to the central axis of the cylinder or ring; wherein the wall is molded integrally on each end surface in a direction along the central axis of each of the housing parts. In cases where the pair of fixing members is provided, each fixing member is fixed to the installation target by inserting and tightening a screw in the screw hole of each fixing member and, thus, the noise current absorber is installed on the installation target. Force in a direction along the central axis is applied to one of the housing parts at the time of fixing, but if the wall is molded integrally with each of the end surfaces in the direction along the central axis of the housing part, displacement of the pair of housing parts can be suppressed in an excellent manner.

(5E) Moreover, in this case, a configuration is possible in which the wall is configured as a prismatic shape that is molded integrally with each of the housing parts, and that includes one side in an abutting direction of the pair of housing parts; a cross section orthogonal to the abutting direction of the prism is configured as a rectangle having short sides along the central axis; and the short sides are 0.6 mm or longer and long sides in the cross section are 3.8 mm or longer. In this case, as described above, the noise current absorber can be used in an excellent manner in the engine compartment of an automobile or the like.

(5F) In (5D), a configuration is possible in which an auxiliary wall extending along the central axis and molded integrally with the first housing part is molded integrally with the wall; and the wall has dimensions whereby the second housing part can be suppressed from becoming relatively displaced from the first housing part due to rotating of the screw by cooperating with the auxiliary wall. In this case, compared to the dimensions needed for the wall when the auxiliary wall is not provided, the combined dimensions needed for both the wall and the auxiliary wall can be reduced in an excellent manner.

(5G) Moreover, in this case, a configuration is possible in which the wall is configured as a prismatic shape that is molded integrally with each of the housing parts, and that includes one side in an abutting direction of the pair of housing parts; a cross section orthogonal to the abutting direction of the prism is configured as a rectangle having short sides along the central axis; the short sides are 0.6 mm or longer; a dimension along the central axis of the auxiliary wall is 0.9 mm or greater; and a dimension orthogonal to the central axis and the abutting direction of the auxiliary wall is 0.6 mm or greater. In this case, as described above, the noise current absorber can be used in an excellent manner in the engine compartment of an automobile or the like.

Note that in (5G) and (5E) described above, only the lower limits of the dimensions are given but, in many cases it is preferable that these dimensions be the smallest values possible. Therefore, upper limits of these dimensions are values that will be determined naturally depending on the application and the like.

(5H) In (5F) or (5G), a configuration is possible in which the wall and the auxiliary wall engage with the outer peripheral surface of the other housing part at the time of closure. In this case, the pair of housing parts is fixed together in a better manner, and dust and debris can be prevented from getting between the abutting surfaces of the housing parts in an excellent manner.

(5I) Additionally, a configuration is possible that further includes guide sides that are molded on at least one of the housing parts in a protruding manner so as to sandwich the belt-like member on the outer peripheral surface of the housing part when the belt-like member, which includes screw holes at both ends through which screws can be inserted, is fixed across the noise current absorber to an installation target using screws. In this case, the noise current absorber can be installed on the installation target via the belt-like member, which is fitted between the guide sides, without tightening screws directly in the noise current absorber. Additionally, when installing such a noise current absorber, the housing parts tend to become relatively displaced from each other due to the tightening of the screws in the belt-like member, but this relative displacement of the housing parts can be suppressed as described above.

What is claimed is:

1. A noise current absorber, comprising:
   a pair of magnetic bodies that exhibit an overall cylindrical shape or ring shape when abutted against each other;
   a pair of housing parts each including a concave portion, each of the concave portions being capable of housing either of the pair of magnetic bodies, and the pair of magnetic bodies exhibiting a cylindrical shape or ring shape at a time of closure when the concave portions are abutted against each other while the magnetic bodies are housed in the concave portions;
   an engaging portion and an engaged portion provided on each of the pair of housing parts across a center of the cylinder or ring of the pair of magnetic bodies, by engaging with each other at the time of closure, the engaging portion and the engaged portion being capable of maintaining a closed state where the pair of magnetic bodies exhibits a cylindrical shape or a ring shape; and
   a wall molded integrally with at least a first housing part of the pair of housing parts adjacent to an abutting surface of at least the first housing part against a second housing part of the pair of housing parts, the wall protruding to a side from which the second housing part abuts;
   and
   a pair of fixing members configured to be fixed to an installation target, each of the pair of fixing members being molded integrally on an outer side of each of the housing parts, and including a screw hole into which the screw can be inserted in a direction orthogonal to a central axis of the cylinder or ring; wherein
   the wall is molded integrally on each end surface in a direction along the central axis of each of the housing parts,
   the wall is configured as a prismatic shape molded integrally with each of the housing parts, and includes one side in an abutting direction of the pair of housing parts,
   a cross section orthogonal to the abutting direction of the prism is configured as a rectangle having short sides along the central axis, and
   the short sides are 0.6 mm or longer and long sides in the cross section are 3.8 mm or longer.

2. The noise current absorber according to claim 1, wherein:
   the wall is provided in plurality so as to suppress each of displacement occurring when the screw is rotated in a first rotation direction, and displacement occurring when the screw is rotated in a second rotation direction different from the first rotation direction.

3. The noise current absorber according to claim 2, wherein:
   the wall engages with an outer peripheral surface of the second housing part at the time of closure.

4. The noise current absorber according to claim 1, wherein:
   the wall engages with an outer peripheral surface of the second housing part at the time of closure.

5. The noise current absorber of claim 1, wherein the pair of housing parts have the same shape.

6. A noise current absorber, comprising:
   a pair of magnetic bodies that exhibit an overall cylindrical shape or ring shape when abutted against each other;
   a pair of housing parts each including a concave portion, each of the concave portions being capable of housing either of the pair of magnetic bodies, and the pair of magnetic bodies exhibiting a cylindrical shape or ring shape at a time of closure when the concave portions are abutted against each other while the magnetic bodies are housed in the concave portions;
   an engaging portion and an engaged portion provided on each of the pair of housing parts across a center of the cylinder or ring of the pair of magnetic bodies, by engaging with each other at the time of closure, the engaging portion and the engaged portion being capable of maintaining a closed state where the pair of magnetic bodies exhibits a cylindrical shape or a ring shape; and
   a wall molded integrally with at least a first housing part of the pair of housing parts adjacent to an abutting surface of at least the first housing part against a second housing part of the pair of housing parts, the wall protruding to a side from which the second housing part abuts;

a pair of fixing members configured to be fixed to an installation target, each of the pair of fixing members being molded integrally on an outer side of each of the housing parts, and including a screw hole into which the screw can be inserted in a direction orthogonal to a central axis of the cylinder or ring; wherein the wall is molded integrally on each end surface in a direction along the central axis of each of the housing parts, an auxiliary wall extending along the central axis and molded integrally with the first housing part is molded integrally with the wall; and the wall has dimensions whereby the second housing part can be suppressed from becoming relatively displaced from the first housing part due to rotating of the screw by cooperating with the auxiliary wall.

7. The noise current absorber according to claim 6, wherein:

the wall is provided in plurality so as to suppress each of displacement occurring when the screw is rotated in a first rotation direction, and displacement occurring when the screw is rotated in a second rotation direction different from the first rotation direction.

8. The noise current absorber according to claim 7, wherein:

the wall or the auxiliary wall engages with an outer peripheral surface of the second housing part at the time of closure.

9. The noise current absorber according to claim 6, wherein:

the wall or the auxiliary wall engages with an outer peripheral surface of the second housing part at the time of closure.

10. The noise current absorber of claim 6, wherein the pair of housing parts have the same shape.

* * * * *